(12) United States Patent
Chao et al.

(10) Patent No.: US 10,243,060 B2
(45) Date of Patent: Mar. 26, 2019

(54) UNIFORM LOW-K INNER SPACER MODULE IN GATE-ALL-AROUND (GAA) TRANSISTORS

(71) Applicant: International Business Machines Corporation, Armonk, NY (US)

(72) Inventors: Robin H. Chao, Wappingers Falls, NY (US); ChoongHyun Lee, Rensselaer, NY (US); Chun W. Yeung, Niskayuna, NY (US); Jingyun Zhang, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 2 days.

(21) Appl. No.: 15/468,755

(22) Filed: Mar. 24, 2017

(65) Prior Publication Data
US 2018/0277656 A1    Sep. 27, 2018

(51) Int. Cl.
| | |
|---|---|
| *H01L 29/66* | (2006.01) |
| *H01L 21/02* | (2006.01) |
| *H01L 21/3065* | (2006.01) |
| *H01L 29/78* | (2006.01) |
| *H01L 29/06* | (2006.01) |

(52) U.S. Cl.
CPC .... *H01L 29/66553* (2013.01); *H01L 21/0214* (2013.01); *H01L 21/02247* (2013.01); *H01L 21/02255* (2013.01); *H01L 21/02332* (2013.01); *H01L 21/3065* (2013.01); *H01L 29/0653* (2013.01); *H01L 29/0665* (2013.01); *H01L 29/6653* (2013.01); *H01L 29/6681* (2013.01); *H01L 29/66818* (2013.01); *H01L 29/7853* (2013.01)

(58) Field of Classification Search
CPC .......... H01L 29/66553; H01L 29/0653; H01L 29/0665; H01L 29/6653; H01L 29/6681; H01L 29/66818; H01L 29/7853; H01L 21/0214; H01L 21/02247; H01L 21/02255; H01L 21/02332; H01L 21/3065
See application file for complete search history.

(56) References Cited

U.S. PATENT DOCUMENTS

| | | | |
|---|---|---|---|
| 6,352,906 B1* | 3/2002 | Leobandung | H01L 21/76264 257/E21.564 |
| 7,829,943 B2 | 11/2010 | Sell | |
| 2002/0081864 A1* | 6/2002 | Zheng | C23C 16/0272 438/791 |
| 2006/0128077 A1* | 6/2006 | Park | H01L 21/28202 438/149 |
| 2015/0035060 A1* | 2/2015 | Cheng | H01L 27/092 257/351 |
| 2015/0221676 A1 | 8/2015 | Holt et al. | |

(Continued)

*Primary Examiner* — Calvin Y Choi
(74) *Attorney, Agent, or Firm* — Cantor Colburn LLP; Vazken Alexanian

(57) ABSTRACT

Embodiments are directed to a method of forming a stacked nanosheet and resulting structures having uniform low-k inner spacers. A nanosheet stack is formed opposite a major surface of a substrate. The nanosheet stack includes multiple nanosheets. Cavities are formed between adjacent ones of the multiple nanosheets. The cavities are filled with an oxide material and portions of the oxide material are nitridized to form inner spacers positioned between the adjacent ones of the multiple nanosheets.

20 Claims, 10 Drawing Sheets

(56) References Cited

U.S. PATENT DOCUMENTS

2016/0027870 A1\* 1/2016 Cheng ................ H01L 29/0673
  257/347
2016/0163796 A1\* 6/2016 Obradovic ............ B82Y 10/00
  257/9
2016/0225766 A1 8/2016 Cheng et al.

\* cited by examiner

UNIFORM LOW-K INNER SPACER MODULE IN GATE-ALL-AROUND (GAA) TRANSISTORS

BACKGROUND

The present invention relates in general to semiconductor device fabrication methods and resulting structures. More specifically, the present invention relates to fabrication methods and resulting structures for forming a uniform low-k inner spacer in a stacked nanosheet structure.

In contemporary semiconductor device fabrication processes a large number of semiconductor devices, such as field effect transistors (FETs), are fabricated on a single wafer. Some non-planar device architectures, such as nanosheet FETs, provide increased device density and some increased performance over lateral devices. In nanosheet FETs, in contrast to conventional FETs, the gate stack wraps around the full perimeter of each nanosheet, enabling fuller depletion in the channel region, and reducing short-channel effects due to steeper subthreshold swing (SS) and smaller drain induced barrier lowering (DIBL). The wrap-around gate structures and source/drain contacts used in nanosheet devices also enable greater management of leakage current and parasitic capacitance in the active regions, even as drive currents increase.

SUMMARY

According to one or more embodiments of the present invention, a method of fabricating a stacked nanosheet having uniform low-k inner spacers is provided. A non-limiting example of the method includes forming a nanosheet stack opposite a major surface of a substrate. The nanosheet stack includes multiple nanosheets. The method further includes forming cavities between adjacent ones of the multiple nanosheets. The cavities are filled with an oxide material and portions of the oxide material are nitridized to form inner spacers positioned between the adjacent ones of the multiple nanosheets.

According to one or more embodiments of the present invention, a method of fabricating a stacked nanosheet having uniform low-k inner spacers is provided. A non-liming example of the method includes forming a nanosheet stack opposite a major surface of a substrate. The nanosheet stack includes multiple nanosheets. The method further includes forming cavities between adjacent ones of the multiple nanosheets. The cavities are filled with a first oxide material and portions of the first oxide material are nitridized to form a first portion of an inner spacer positioned between the adjacent ones of the multiple nanosheets. The method further includes forming a second oxide material adjacent to the first portion of the inner spacer. The second oxide material is nitridized to form a second portion of the inner spacer positioned between the adjacent ones of the multiple nanosheets.

According to one or more embodiments of the present invention, a stacked nanosheet structure having uniform low-k inner spacers is provided. A non-limiting example of the structure includes a nanosheet stack formed opposite a major surface of a substrate. The nanosheet stack includes a first nanosheet vertically stacked over a second nanosheet. The structure further includes a conductive gate formed over a channel region of the first and second nanosheets. The structure further includes a nitridized inner spacer positioned between the first and second nanosheets and adjacent to the conductive gate.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

DETAILED DESCRIPTION

Figure 1:
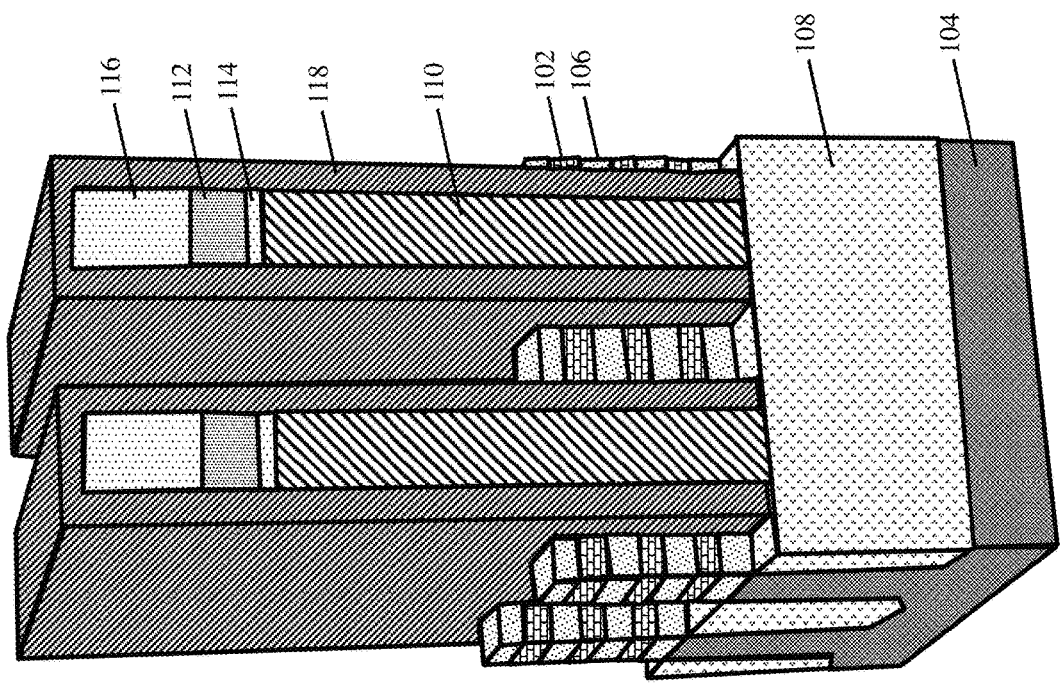
FIG. 1 depicts a cross-sectional view of a structure having nanosheets formed on a substrate during an intermediate operation of a method of fabricating a semiconductor device according to one or more embodiments of the present invention.

Various embodiments of the present invention are described herein with reference to the related drawings.

Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. The term "selective to," such as, for example, "a first element selective to a second element," means that a first element can be etched and the second element can act as an etch stop. The term "conformal" (e.g., a conformal layer) means that the thickness of the layer is substantially the same on all surfaces, or that the thickness variation is less than 15% of the nominal thickness of the layer.

As used herein, the terms "about," "substantially," "approximately," and variations thereof are intended to include the degree of error associated with measurement of the particular quantity based upon the equipment available at the time of filing the application. For example, "about" can include a range of ±8% or 5%, or 2% of a given value.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), plasma-enhanced chemical vapor deposition (PECVD), electrochemical deposition (ECD), molecular beam epitaxy (MBE), and more recently, atomic layer deposition (ALD) and plasma-enhanced atomic layer deposition (PEALD), among others.

Removal/etching is any process that removes material from the wafer. Examples include etch processes (either wet or dry), and chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.)

are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a description of technologies that are more specifically relevant to the present invention, as previously noted herein, non-planar device architectures, such as nanosheet FET devices, result in increased device density over lateral devices. There are challenges, however, in providing non-planar architectures for scaling beyond the 10 nm node. The fabrication of nanosheet FET semiconductor structures requires forming an inner spacer between adjacent nanosheets. The inner spacer acts to reduce the parasitic overlap capacitance between the gate and the source/drain epitaxy regions. Parasitic capacitance between two conductors (also known as conductor-to-conductor capacitance) is a function of the length and thickness of the conductors as well as the distance separating the conductors. Parasitic capacitance contributes to undesired device effects such as resistive-capacitive (RC) delay, power dissipation, and cross-talk. RC delay refers to the delay in signal speed or propagation experienced in a circuit as a function of the product of the resistance and capacitance of the circuit components. Unfortunately, parasitic capacitance continues to increase as device dimensions and component spacing shrinks to meet increasing demands for smaller electronic devices.

While the use of inner spacers serves to reduce the parasitic overlap capacitance between the gate and the source/drain epitaxy regions, the use of inner spacers introduces gate length variabilities and replacement metal gate (RMG) fabrication difficulties. The gate lengths on the top and bottom surfaces of a nanosheet are determined by the respective dimensions of the top and bottom inner spacers. Consequently, to improve process control it is desirable to have a sharp, well-defined inner spacer boundary. Conventional processes for forming inner spacers in a stacked nanosheet structure, however, tend to deform the channel into a crescent shape because the lack of an etch stop layer allows for the wet etch to undercut into the channel region. Consequently, it is difficult to ensure a uniform gate length for all nanosheet surfaces. Various modifications to the conventional inner spacer process flow have been explored to address these shortcomings. The use of single nitride spacers, for example, improves the inner spacer boundary but introduces new defects due to the low selectivity between silicon nitride (SiN) and silicoboron carbonitride (SiBCN). The use of dual oxide-nitride spacers also improves the inner spacer boundary but conventional approaches require an oxide liner which results in inner spacer lift off during RMG.

Turning now to an overview of the aspects of the present invention, one or more embodiments provide methods of fabricating a nanosheet stack having uniform low-k inner spacers. A nanosheet stack having nanosheets alternating with sacrificial layers is formed on a substrate. The sacrificial layers are removed and replaced by oxide sheets. Portions of the oxide sheet are nitridized using, for example, an ammonia ($NH_3$) diffusion-limited rapid thermal nitridation (RTN) to form an inner spacer. Fabrication then continues according to known RMG processes. Forming a single nitride spacer according to the embodiments of the invention described herein allows for an improved inner spacer boundary without limiting the process due to the low selectivity between SiN and SiBCN.

Example methods for fabricating a stacked nanosheet having uniform low-k inner spacers and the resulting structures therefrom in accordance with embodiments of the present invention are described in detail below by referring to the accompanying drawings in FIGS. 1-10.

FIG. 1 illustrates a cross-sectional view of a structure 100 having nanosheets 102 (stacked nanosheets are collectively referred to as nanosheet stacks) formed on a substrate 104 during an intermediate operation of a method of fabricating a semiconductor device according to one or more embodiments. In some embodiments, the nanosheets 102 are vertically-stacked nanosheets. In some embodiments, the nanosheets 102 alternate with sacrificial layers 106. For ease of discussion reference is made to operations performed on and to a nanosheet stack having three nanosheets (e.g., nanosheets 102) alternating with four sacrificial layers (e.g., sacrificial layers 106). It is understood, however, that the nanosheet stack can include any number of nanosheets alternating with a corresponding number of sacrificial layers. For example, the nanosheet stack can include a single nanosheet, two nanosheets, five nanosheets, eight nanosheets, or any number of nanosheets, along with a corresponding number of sacrificial layers (i.e., as appropriate to form a nanosheet stack having a topmost sacrificial layer on a topmost nanosheet, a bottommost sacrificial layer under a bottommost nanosheet, and a sacrificial layer between each pair of adjacent nanosheets).

The nanosheets 102 can be any suitable material such as, for example, monocrystalline silicon (Si), SiGe, Group III-V channel material, or other suitable channel materials. Group III-V channel materials include materials having at least one group III element and at least one group V element, such as, for example, one or more of aluminum gallium arsenide, aluminum gallium nitride, aluminum arsenide, aluminum indium arsenide, aluminum nitride, gallium antimonide, gallium aluminum antimonide, gallium arsenide, gallium arsenide antimonide, gallium nitride, indium antimonide, indium arsenide, indium gallium arsenide, indium gallium arsenide phosphide, indium gallium nitride, indium nitride, indium phosphide and alloy combinations including at least one of the foregoing materials. In some embodiments, the nanosheets 102 are nFET nanosheets. In some embodiments, the nFET nanosheets are Si nFET nanosheets. In some embodiments, the nanosheets 102 have a thickness of about 4 nm to about 10 nm, although other thicknesses are within the contemplated scope of the invention. In yet other embodiments, the nanosheets 102 have a thickness of about 6 nm, although other thicknesses are within the contemplated scope of the invention.

The substrate 104 can be any suitable substrate material, such as, for example, monocrystalline Si, SiGe, SiC, III-V compound semiconductor, II-VI compound semiconductor, or semiconductor-on-insulator (SOI). In some embodiments, the substrate 104 includes a buried oxide layer (not depicted). In some embodiments, the substrate 104 includes both an nFET Region and a pFET Region. In some embodiments, the substrate 104 includes either an nFET Region or a pFET Region. In some embodiments, the substrate 104 includes a shallow trench isolation (STI) 108. The STI 108 prevents electrical current leak between adjacent semiconductor device components (e.g., between adjacent nanosheet stacks). The STI 108 can be of any suitable dielectric material, such as, for example, a silicon oxide. Any known manner of forming the STI 108 can be utilized. In some embodiments, the STI 108 is formed by etching back the substrate 104 to form a trench, filling the trench with the STI 108 material, and planarizing to a surface of the substrate 104 using, for example, a CMP process.

In some embodiments, the sacrificial layers 106 can be Si or SiGe. In embodiments where the nanosheets 102 are Si nFET nanosheets the sacrificial layers 106 are SiGe layers. In some embodiments, the sacrificial layers 106 have a thickness of about 4 nm to about 15 nm, although other thicknesses are within the contemplated scope of the invention. In yet other embodiments, the sacrificial layers 106 have a thickness of about 10 nm.

A sacrificial gate 110 (also known as a dummy gate in RMG processes) is formed over a channel region of the nanosheet 102. The sacrificial gate 110 can be made of any suitable material, such as, for example, amorphous silicon (a-Si) or polysilicon. Any known method for patterning a sacrificial gate can be used, such as, for example, a wet etch, a dry etch, or a combination of sequential wet and/or dry etches. For example, in some embodiments, a layer of a-Si is etched using a patterned hard mask (not depicted) to form the sacrificial gate 110. In some embodiments, a hard mask 112 is formed on the sacrificial gate 110. The hard mask 112 can be made of any suitable material, such as, for example, a silicon nitride, $SiO_2$, SiON, a silicon oxygen carbonitride (SiOCN), or SiBCN. In some embodiments, a thin silicon oxide film 114 is formed between the hard mask 112 and the sacrificial gate 110. In some embodiments, a dielectric layer 116 is formed on the hard mask 112. The dielectric layer 116 can be made of any suitable dielectric material, such as, for example, porous silicates, carbon doped oxides, silicon dioxide, silicon nitrides, silicon oxynitrides, or other dielectric materials.

In some embodiments, spacers 118 are formed on sidewalls of the sacrificial gate 110 using known RMG processes. In some embodiments, the spacers 118 are formed using a CVD, PECVD, ALD, PVD, chemical solution deposition, or other like process in combination with a wet or dry etch process. The spacers 118 can be made of any suitable material, such as, for example, a low-k dielectric, a nitride, silicon nitride, silicon dioxide, SiON, SiC, SiOCN, or SiBCN.

Figure 2:
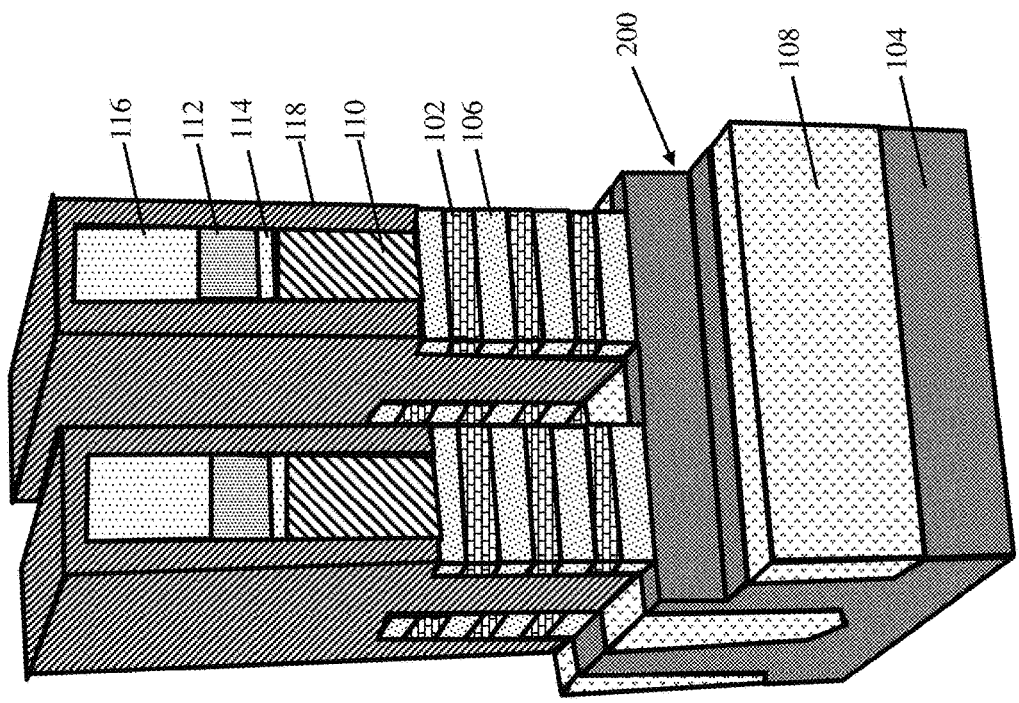
FIG. 2 depicts a cross-sectional view of the structure after removing portions of the nanosheets, sacrificial layers, and substrate to form a source/drain recess during an intermediate operation of a method of fabricating a semiconductor device according to one or more embodiments of the present invention.

FIG. 2 illustrates a cross-sectional view of the structure 100 after removing portions of the nanosheets 102, the sacrificial layers 106, and the substrate 104 to form a source/drain recess 200 during an intermediate operation of a method of fabricating a semiconductor device according to one or more embodiments. The source/drain recess 200 can be formed using conventional processes, such as, for example, a wet etch, a dry etch, or a combination of sequential wet and/or dry etches. Doped regions (not depicted) are formed on opposite ends of the nanosheet 102 in the source/drain recess 200. The doped regions can be source or drain regions formed in the substrate 104 by a variety of methods, such as, for example, in-situ doped epitaxy, doped following the epitaxy, or by implantation and plasma doping. In some embodiments, the doped regions are complementary, such that one of the doped regions is a source while the other is a drain. The doped regions can be formed by any suitable process, including but not limited to, ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), and MBE. In some embodiments, the doped regions include epitaxial semiconductor materials grown from gaseous or liquid precursors. In some embodiments, epitaxial regions are epitaxially grown over the substrate 104. Epitaxial semiconductor materials can be grown using vapor-phase epitaxy (VPE), MBE, liquid-phase epitaxy (LPE), or other suitable processes. Epitaxial silicon, SiGe, and/or carbon doped silicon (Si:C) can be doped during deposition (in-situ doped) by adding dopants, n-type dopants (e.g., phosphorus or arsenic) or p-type dopants (e.g., Ga, B, B $F_2$, or Al). The dopant concentration in the doped regions can range from $1\times10^{19}$ $cm^{-3}$ to $2\times10^{21}$ $cm^{-3}$, or between $1\times10^{20}$ $cm^{-3}$ and $1\times10^{21}$ $cm^{-3}$.

In some embodiments, the gas source for the deposition of epitaxial semiconductor material includes a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. In some embodiments, the doped regions include silicon. In some embodiments, the doped regions include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

Figure 3:
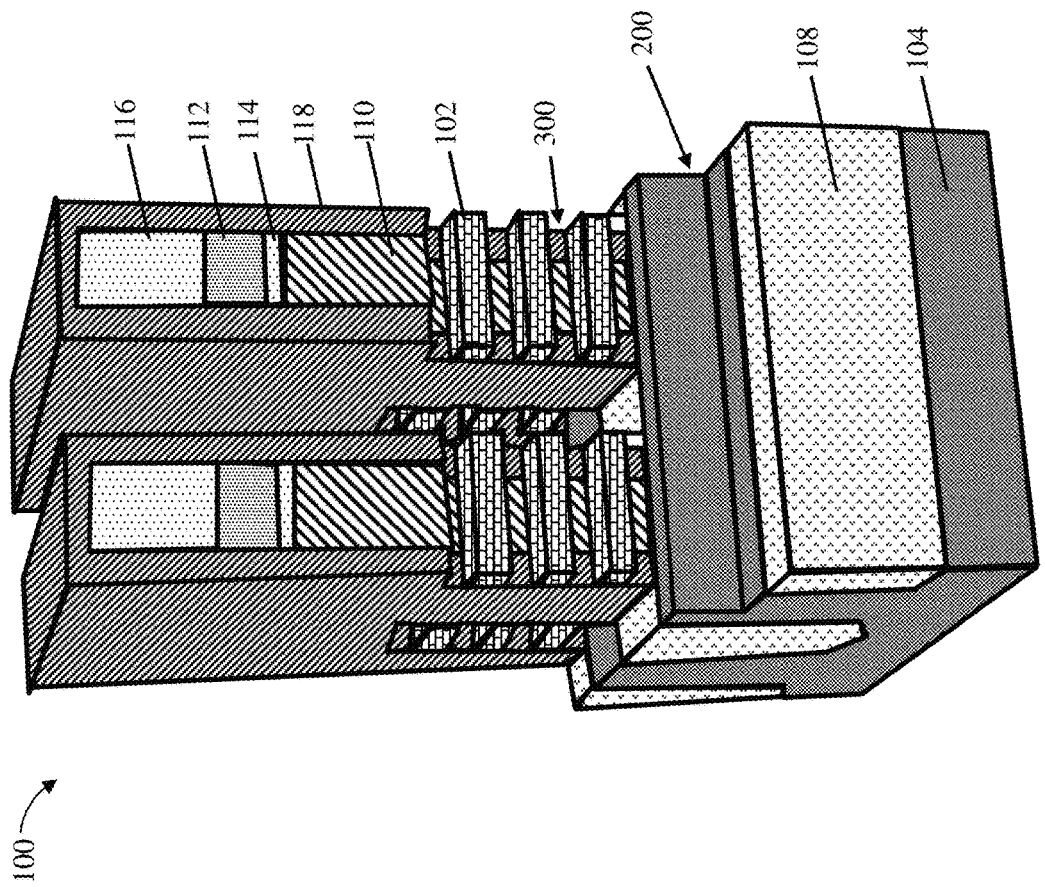
FIG. 3 depicts a cross-sectional view of the structure after completely removing the sacrificial layers to form recessed regions during an intermediate operation of a method of fabricating a semiconductor device according to one or more embodiments of the present invention.

FIG. 3 illustrates a cross-sectional view of the structure 100 after completely removing the sacrificial layers 106 to form recessed regions 300 during an intermediate operation of a method of fabricating a semiconductor device according to one or more embodiments. The sacrificial layers 106 are removing using a hydrochloric acid (HCl) vapor etch to ensure complete removal.

Figure 4:
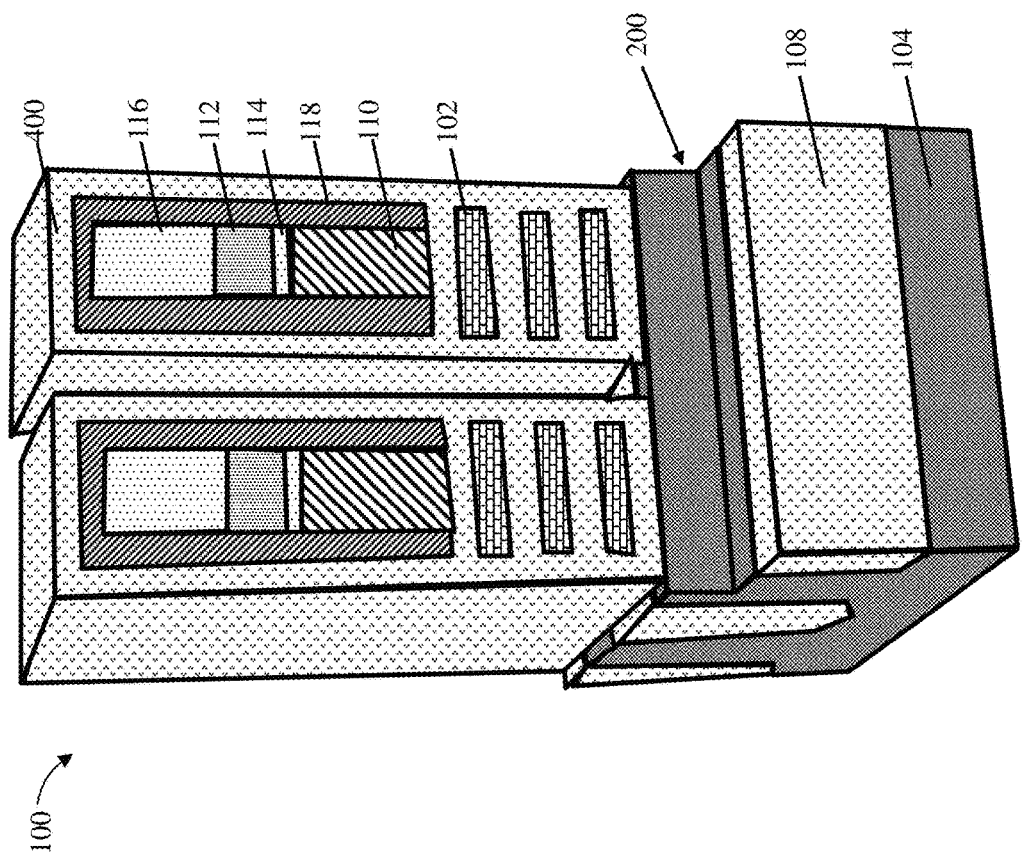
FIG. 4 depicts a cross-sectional view of the structure after forming an oxide layer over the nano sheets, sacrificial gate, and spacers during an intermediate operation of a method of fabricating a semiconductor device according to one or more embodiments of the present invention.

FIG. 4 illustrates a cross-sectional view of the structure 100 after forming an oxide layer 400 over the nanosheets 102, sacrificial gate 110, and spacers 118 during an intermediate operation of a method of fabricating a semiconductor device according to one or more embodiments. The oxide layer 400 completely fills the recessed regions 300. The oxide layer 400 can be any suitable material, such as, for example, a low-k dielectric, $SiO_2$, SiON, and SiOCN. Any known manner of forming the oxide layer 400 can be utilized. In some embodiments, the oxide layer 400 is $SiO_2$ conformally formed on exposed surfaces of the structure 100 using a conformal deposition process such as CVD or ALD to ensure that the oxide layer 400 pinches off the recessed regions 300 (i.e., the space between adjacent channel regions). In some embodiments, the oxide layer 400 is conformally formed to a thickness of about four (4) nanometers.

Figure 5:
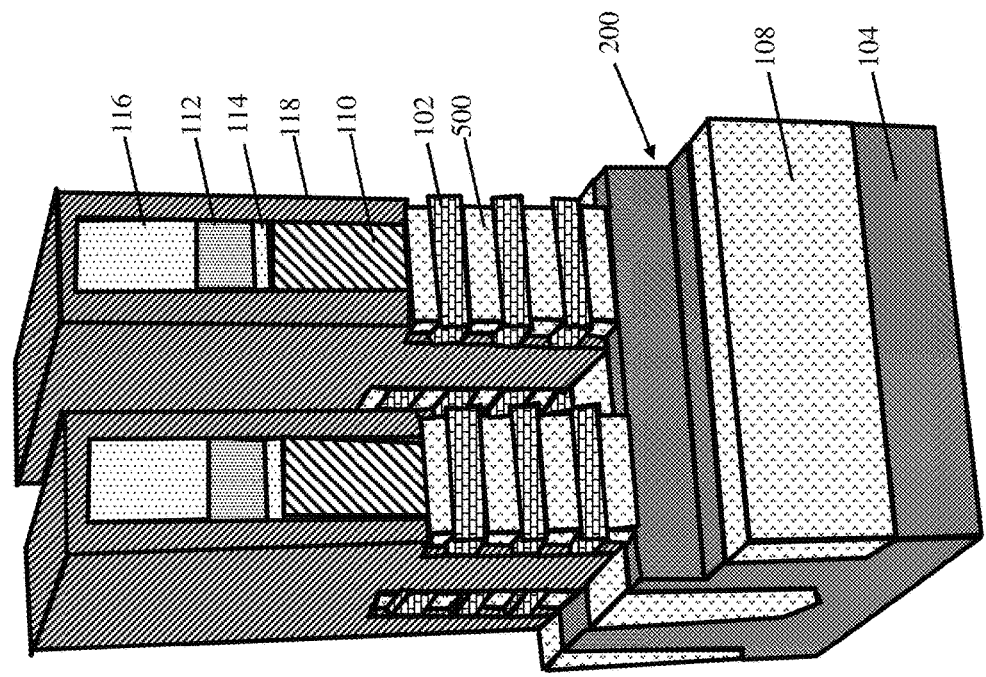
FIG. 5 depicts a cross-sectional view of the structure after removing portions of the oxide layer to form oxide sheets during an intermediate operation of a method of fabricating a semiconductor device according to one or more embodiments of the present invention.

FIG. 5 illustrates a cross-sectional view of the structure 100 after removing portions of the oxide layer 400 to form oxide sheets 500 during an intermediate operation of a method of fabricating a semiconductor device according to one or more embodiments. Portions of the oxide layer 400 can be removed using any suitable process, such as, for example, a wet etch or dilute hydrofluoric acid (dHF) wash. The remaining portions of the oxide layer 400 (i.e., those portions formed in the recessed regions 300) define the oxide sheets 500. In some embodiments, the removal process used to form the oxide sheets 500 causes a two to three (2-3) nanometer over etch (also known as gouging) of the oxide sheets 500 with respect to end portions of the nanosheets 102.

Figure 6:
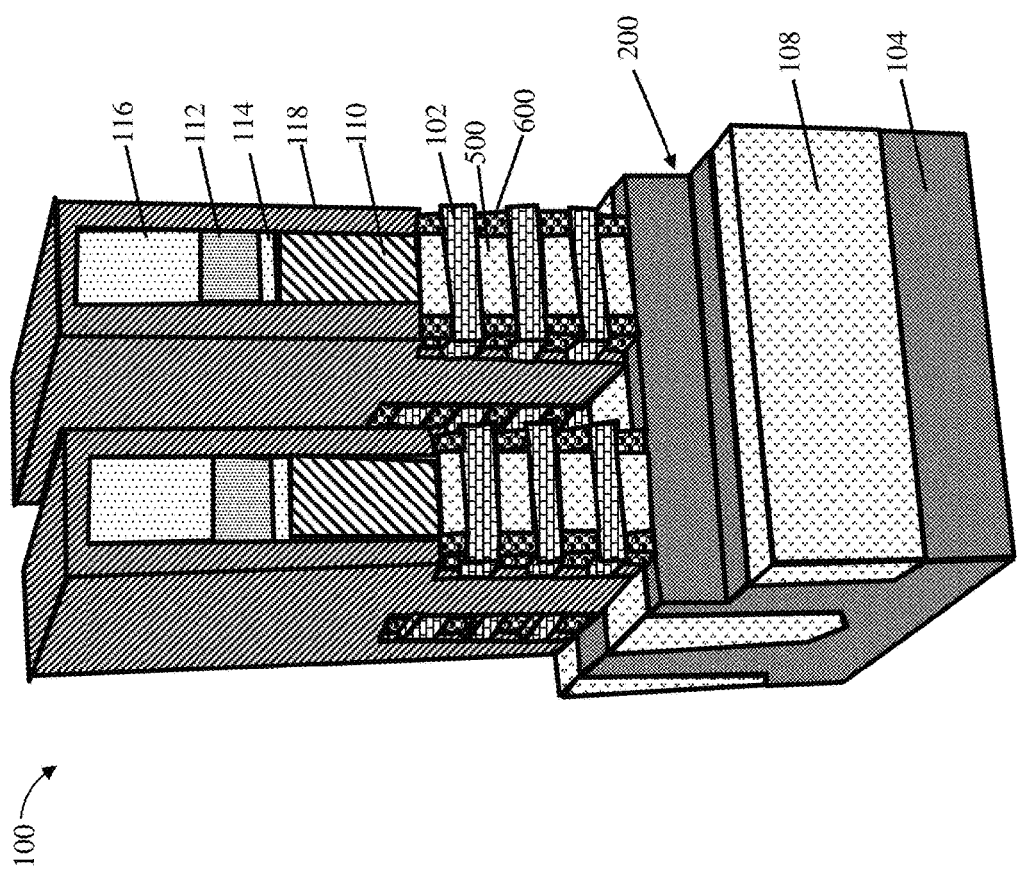
FIG. 6 depicts a cross-sectional view of the structure after nitridizing portions of the oxide sheets during an intermediate operation of a method of fabricating a semiconductor device according to one or more embodiments of the present invention.

FIG. 6 illustrates a cross-sectional view of the structure 100 after nitridizing portions of the oxide sheets 500 using a diffusion-limiting (also known as a self-limiting) rapid thermal nitridation (RTN) process during an intermediate operation of a method of fabricating a semiconductor device according to one or more embodiments. The self-limiting RTN process works by converting $SiO_2$ to $Si_3N_4$ according to the following reaction scheme:

$$4NH_3 + 3SiO_2 \rightarrow Si_3N_4 + 6H_2O \qquad (I)$$

The self-limiting RTN process is well-controlled (self-limited) by the diffusion rate of $NH_3$. In this manner, exposed portions (i.e., end portions) of the oxide sheets 500 are converted into silicon oxynitride (SiON) inner spacers 600 having improved uniform boundaries with respect to conventional nitride-based inner spacers. In some embodiments, the RTN process is optimized to reduce Si nitridation. In some embodiments, the optimized RTN process is completed at a temperature of about 700 degrees C. and at a $NH_3$ partial pressure of about 740 Torr.

In some embodiments, the SiON inner spacers 600 include a nitrogen concentration of about 15 to about 18 percent. In some embodiments, the self-limiting RTN process converts about 2 to about 3 nanometers of each exposed end of the oxide sheets 500. In some embodiments, the nanosheets 102 include silicon and the self-limiting RTN process nitridizes the nanosheets 102 to a depth of about 1 nanometer. The nitridized portions of the nanosheets 102 can be cleaned using known processes, such as, for example, by washing the nitridized portions in hydrofluoric acid diluted by ethylene glycol (HFEG).

Figure 7:
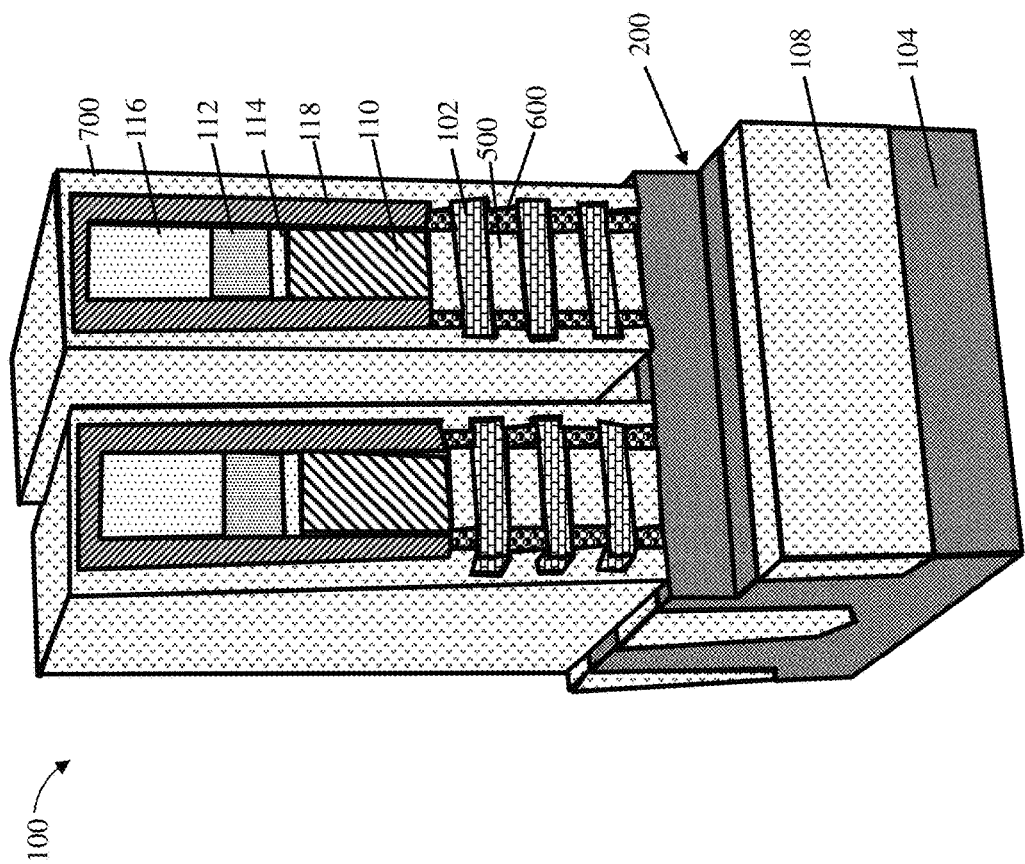
FIG. 7 depicts a cross-sectional view of the structure after forming an oxide layer over the structure during an intermediate operation of a method of fabricating a semiconductor device according to one or more embodiments of the present invention.

FIG. 7 illustrates a cross-sectional view of the structure 100 after forming an oxide layer 700 over the structure 100 during an intermediate operation of a method of fabricating a semiconductor device according to one or more embodiments. The oxide layer 700 ensures that any gouging or etch back of the oxynitride inner spacers 600 (caused during the removal process used to form the oxide sheets 500 as depicted in FIG. 5) is refilled. The oxide layer 700 can be any suitable material, such as, for example, a low-k dielectric, $SiO_2$, SiON, and SiOCN. In some embodiments, the oxide layer 700 is made of the same material as the oxide layer 400. Any known manner of forming the oxide layer 700 can be utilized. In some embodiments, the oxide layer 700 is $SiO_2$ conformally formed on exposed surfaces of the structure 100 using a conformal deposition process such as CVD or ALD. In some embodiments, the oxide layer 700 is conformally formed to a thickness of about two (2) to about three (3) nanometers.

Figure 8:
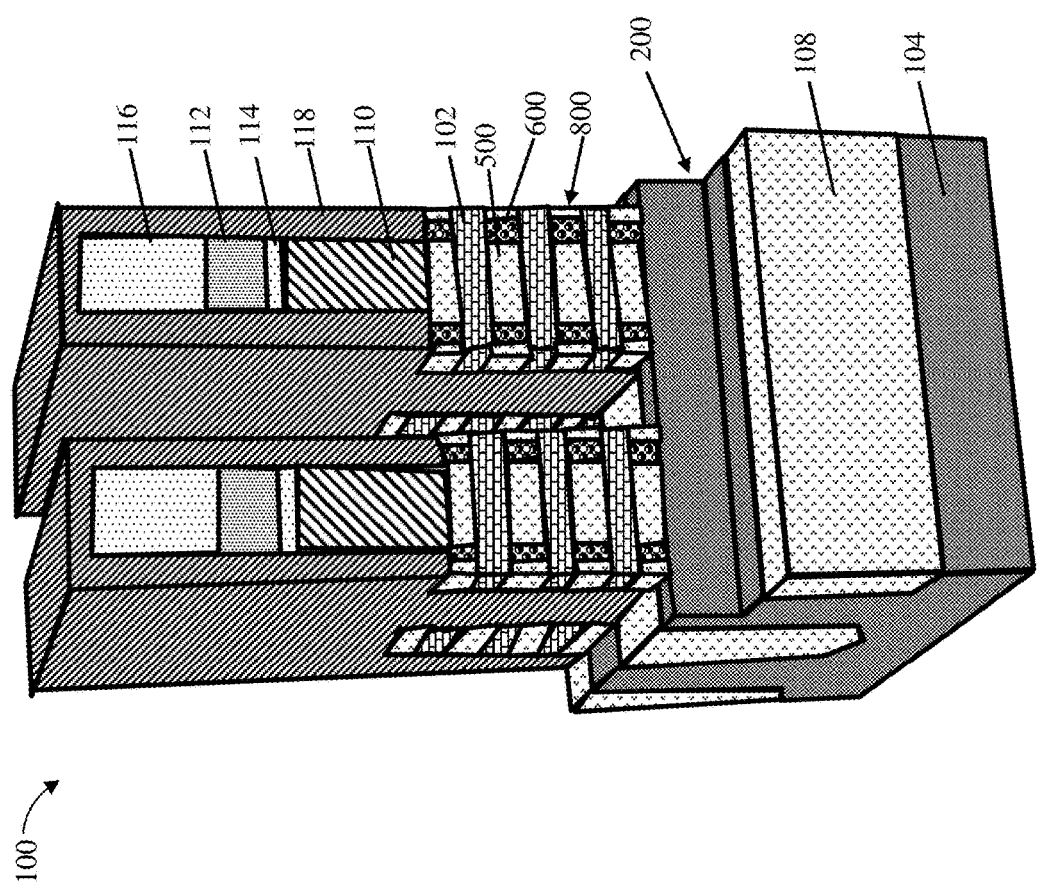
FIG. 8 depicts a cross-sectional view of the structure after removing portions of the oxide layer to form oxide regions in channel regions of the nanosheets during an intermediate operation of a method of fabricating a semiconductor device according to one or more embodiments of the present invention.

FIG. 8 illustrates a cross-sectional view of the structure 100 after removing portions of the oxide layer 700 to form oxide regions 800 in channel regions of the nanosheets 102 during an intermediate operation of a method of fabricating a semiconductor device according to one or more embodiments. Portions of the oxide layer 700 can be removed in a similar manner as the oxide layer 400. In some embodiments, portions of the oxide layer 700 are removed using a wet etch or a dHF wash. The remaining portions of the oxide layer 700 define the oxide regions 800, which fully extend to the ends of the nanosheets 102.

Figure 9:
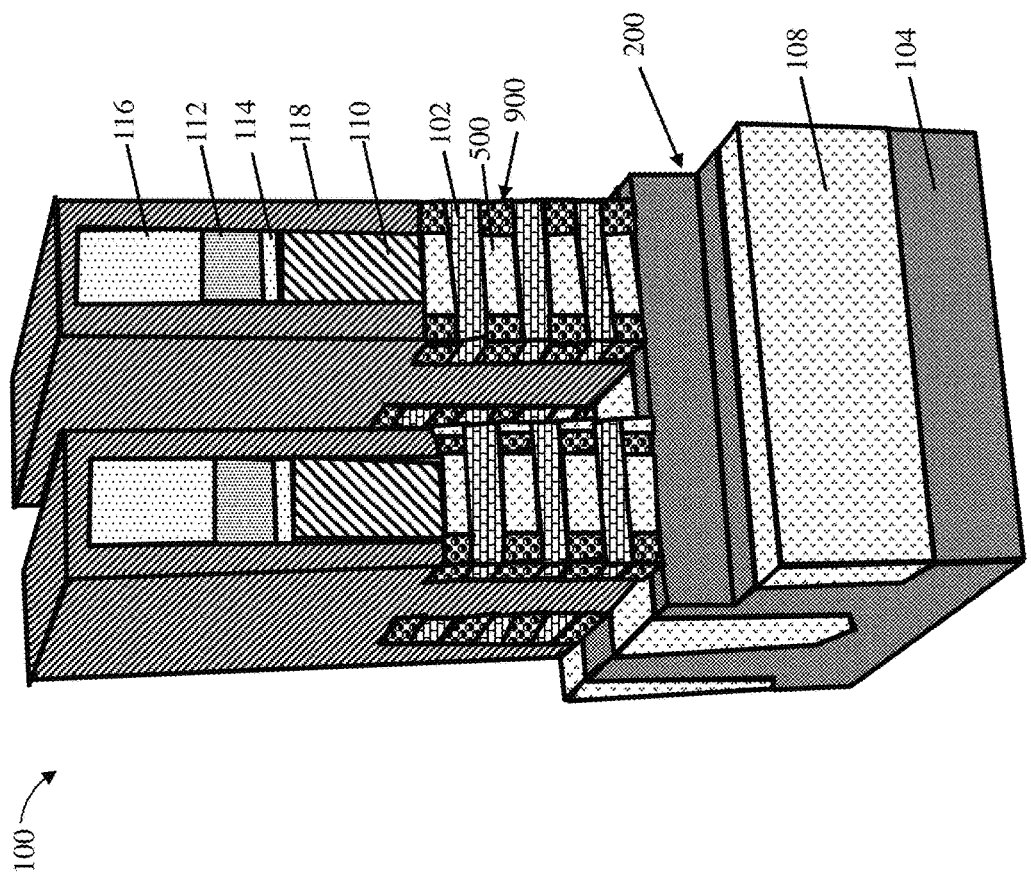
FIG. 9 depicts a cross-sectional view of the structure after nitridizing the oxide regions during an intermediate operation of a method of fabricating a semiconductor device according to one or more embodiments of the present invention.

FIG. 9 illustrates a cross-sectional view of the structure 100 after nitridizing the oxide regions 800 using a second self-limiting RTN process during an intermediate operation of a method of fabricating a semiconductor device according to one or more embodiments. The second self-limiting RTN process works in the same manner as the RTN process used to form the SiON inner spacers 600 and serves to further increase the inner spacer thickness. After the second RTN process the nitridized oxide regions 800 merge with the SiON inner spacers 600 to collectively form a single SiON inner spacer (defining, i.e., inner spacers 900). In some embodiments, the inner spacers 900 have a thickness of about five (5) to about six (6) nanometers. In some embodiments, the second self-limiting RTN process can inadvertently nitridize the nanosheets 102 to a depth of about 1 nanometer. As discussed previously herein, the nitridized portions of the nanosheets 102 can be cleaned using known processes, such as, for example, by washing the nitridized portions in HFEG.

After forming the inner spacers 900, the sacrificial gate 110 and the oxide sheets 500 are replaced with a conductive gate (not depicted) using known RMG processes. The conductive gates can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials.

In some embodiments, a high-k dielectric (not depicted) is formed in the channel region of each nanosheet. The high-k dielectrics can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments, the high-k dielectrics can have a thickness of about 0.5 nm to about 4 nm. In some embodiments, the high-k dielectrics can have a thickness of about 2 nm to about 3 nm, although other thicknesses are within the contemplated scope of the invention.

In some embodiments, work function layers (not depicted) are formed between each of the high-k dielectrics and the conductive gates. The work function layers can be made of work function materials, such as, for example, aluminum, lanthanum oxide, magnesium oxide, strontium titanate, strontium oxide, titanium nitride, titanium aluminum nitride, titanium aluminum carbide, tantalum nitride, and combinations thereof. In some embodiments, the work function layers further modify the work function of each respective gate.

Conductive contacts are then formed or deposited using known nanosheet metallization techniques. In some embodiments, an interlayer dielectric (ILD) is patterned with open trenches and the contacts are deposited into the trenches. In some embodiments, the contacts are overfilled into the trenches, forming overburdens above a surface of the ILD. In some embodiments, a CMP selective to the ILD removes the overburden. The contacts can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments, the contacts can be copper and can include a barrier metal liner. The barrier metal liner prevents the copper from diffusing into, or doping, the surrounding materials, which can degrade their properties. Silicon, for example, forms deep-level traps when doped with copper. An ideal barrier metal liner must limit copper diffusivity sufficiently to chemically isolate the copper conductor from the surrounding materials and should have a high electrical conductivity, for example, tantalum nitride and tantalum (TaN/Ta), titanium, titanium nitride, cobalt, ruthenium, and manganese.

Figure 10:
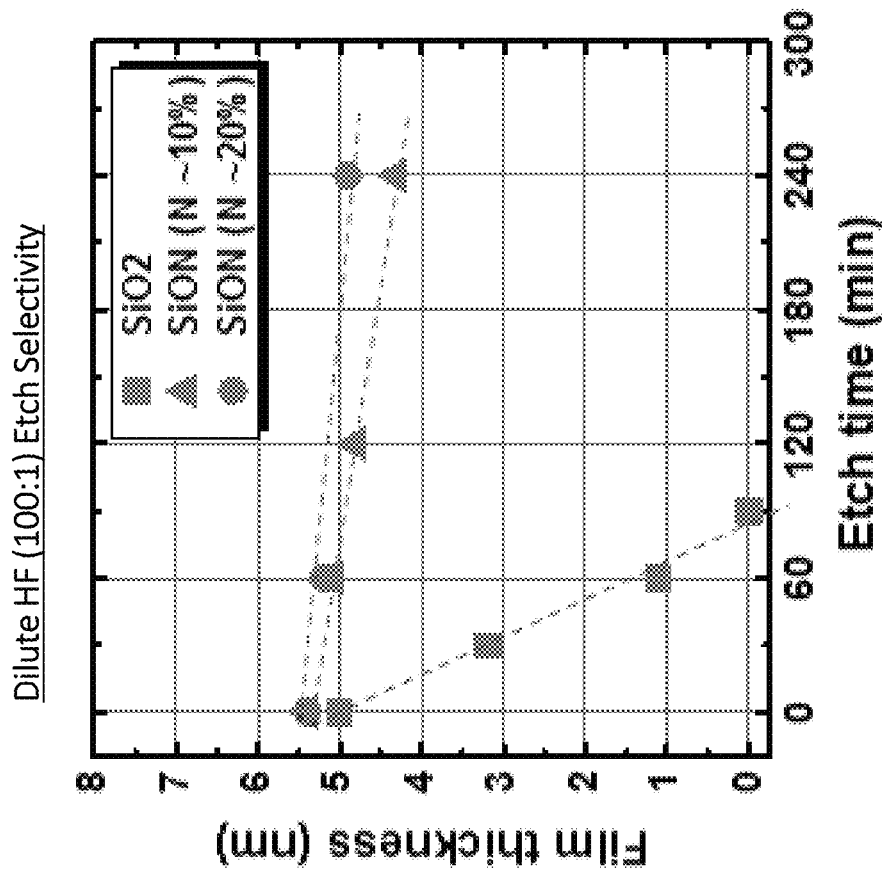
FIG. 10 depicts the dHF etch selectivity of silicon dioxide ($SiO_2$) as compared to silicon oxynitride (SiON) formed according to one or more embodiments of the present invention.

FIG. 10 illustrates the dHF (about 100 parts water to 1 part HF) etch selectivity of $SiO_2$ as compared to SiON having a nitrogen concentration of about 10 percent (SiON-10) and SiON having a nitrogen concentration of about 20 percent (SiON-20) formed according to one or more embodiments and as measured using XPS analysis. The data show that dHF etches $SiO_2$ at a rate of about 40 angstroms per minute. The SiON etch rates are significantly slower. SiON-10 etched at an etch rate of about 2.5 angstroms per minute (about 10 angstroms over four minutes). SiON-20 etched at an etch rate of about 1.25 angstroms per minute (about 5 angstroms over four minutes). Consequently, the etch selectivity of $SiO_2$ over SiON is greater than at least 13:1.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A method for forming a semiconductor device, the method comprising:
   forming a nanosheet stack opposite a major surface of a substrate, the nanosheet stack comprising multiple nanosheets;
   forming cavities between adjacent nanosheets of the multiple nanosheets;
   filling the cavities with an oxide material; and
   nitridizing end portions of the oxide material to form inner spacers positioned between the adjacent nanosheets of the multiple nanosheets.

2. The method of claim 1 further comprising forming a gate over a channel region of the nanosheet stack.

3. The method of claim 1, wherein the nanosheet stack further comprises a plurality of nanosheets alternating with a plurality of sacrificial layers such that each pair of adjacent nanosheets is separated by a sacrificial layer.

4. The method of claim 3, wherein each nanosheet of the nanosheet stack has a thickness of about 4 nm to about 10 nm.

5. The method of claim 1, wherein forming cavities between adjacent nanosheets of the multiple nanosheets comprises removing a sacrificial material using a hydrochloric acid (HCl) vapor etch.

6. The method of claim 1, wherein filling the cavities with an oxide material comprises conformally depositing an oxide layer comprising silicon dioxide ($SiO_2$) to pinch off the cavity.

7. The method of claim 6, wherein filling the cavities with an oxide material further comprises removing portions of the oxide layer outside of the cavity.

8. The method of claim 1, wherein nitridizing portions of the oxide material comprises an ammonia ($NH_3$) diffusion-limited rapid thermal nitridation (RTN).

9. The method of claim 8, wherein the RTN converts silicon dioxide ($SiO_2$) to silicon nitride ($Si_3N_4$).

10. The method of claim 9, wherein the RTN comprises a temperature of about 700 degrees Celsius and an $NH_3$ partial pressure of about 740 Torr.

11. The method of claim 10, wherein the nitridized portions of the oxide sheet comprise silicon oxynitride (SiON).

12. The method of claim 11, wherein the nitridized portions of the oxide material further comprise a nitrogen concentration of about 15 percent to about 18 percent.

13. The method of claim 12, wherein the nitridized portions of the oxide material comprise a thickness of about two (2) to about six (6) nanometers.

14. A method for forming a semiconductor device, the method comprising:
   forming a nanosheet stack opposite a major surface of a substrate, the nanosheet stack comprising multiple nanosheets;
   forming cavities between adjacent nanosheets of the multiple nanosheets;
   filling the cavities with a first oxide material;
   nitridizing end portions of the first oxide material to form a first portion of an inner spacer positioned between the adjacent nanosheets of the multiple nanosheets;
   forming a second oxide material adjacent to the first portion of the inner spacer; and
   nitridizing end portions of the second oxide material to form a second portion of the inner spacer positioned between the adjacent nanosheets of the multiple nanosheets.

15. The method of claim 14 further comprising merging the first and second portions of the inner spacer.

16. A semiconductor device comprising:
   a nanosheet stack formed opposite a major surface of a substrate, the nanosheet stack comprising a first nanosheet vertically stacked over a second nanosheet;
   a conductive gate formed over a channel region of the first and second nanosheets; and a nitridized inner spacer positioned between the first and second nanosheets and adjacent to the conductive gate, wherein the inner space is a uniform low-k inner spacer.

17. The semiconductor device of claim 16, wherein each nanosheet of the nanosheet stack has a thickness of about 4 nm to about 10 nm.

18. The semiconductor device of claim 16, wherein the nitridized inner spacer comprises silicon oxynitride (SiON).

19. The semiconductor device of claim 18, wherein the nitridized inner spacer further comprise a nitrogen concentration of about 15 percent to about 18 percent.

20. The semiconductor device of claim 19, wherein the nitridized inner spacer comprises a thickness of about two (2) to about six (6) nanometers.

* * * * *